Figure 1:
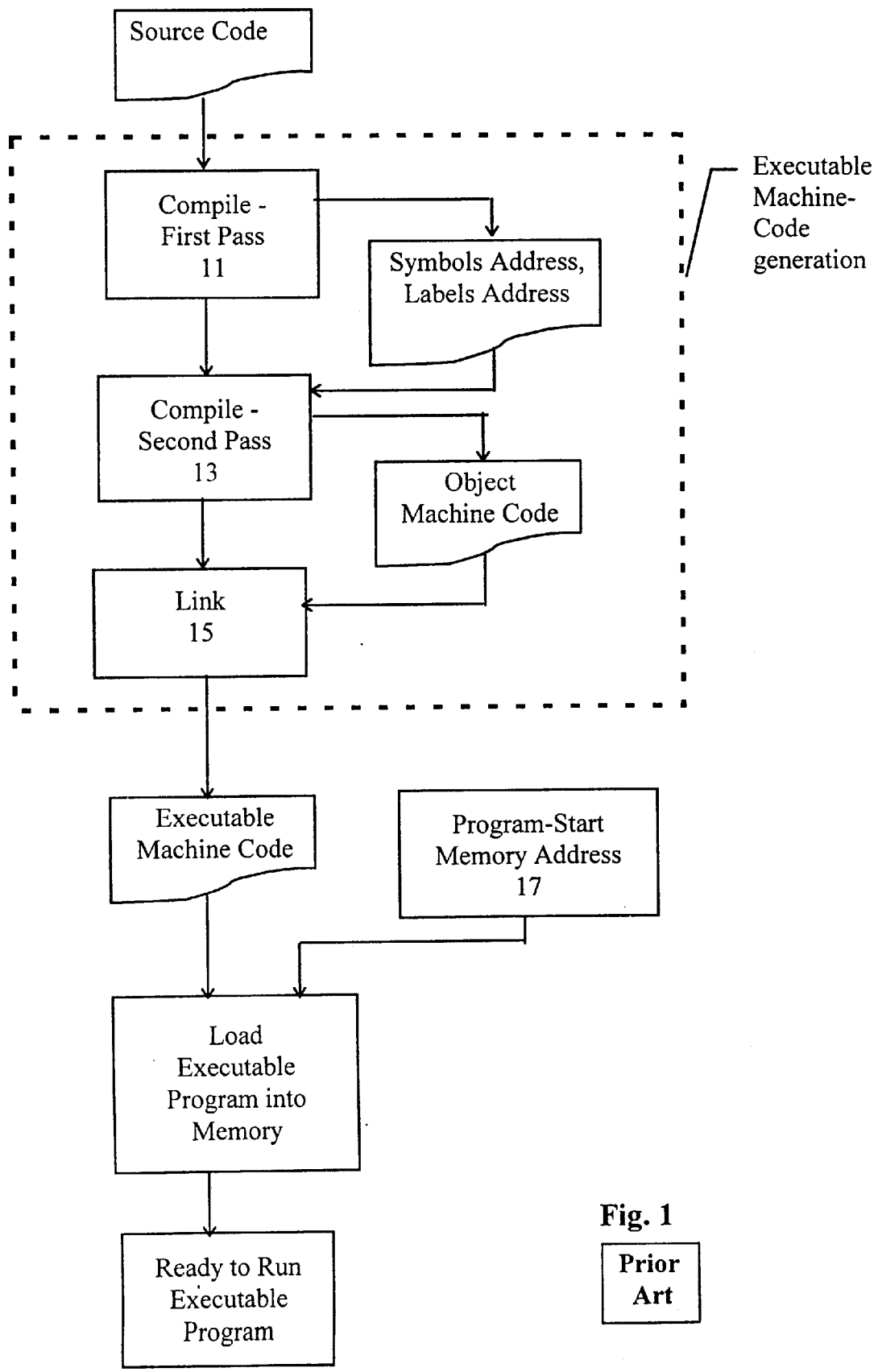

United States Patent [19]
Lin et al.

[11] Patent Number: 6,108,797
[45] Date of Patent: Aug. 22, 2000

[54] METHOD AND SYSTEM FOR LOADING MICROPROGRAMS IN PARTIALLY DEFECTIVE MEMORY

[75] Inventors: Shi-Tron Lin; Ding-Yuan Yang; Meng-Tsang Wu, all of Hsinchu, Taiwan

[73] Assignee: Winbond Electronics Corp., Taiwan

[21] Appl. No.: 08/988,574

[22] Filed: Dec. 11, 1997

[51] Int. Cl.[7] .................................. G06F 12/02
[52] U.S. Cl. .......................... 714/8; 714/35; 714/768
[58] Field of Search ........................ 714/8, 5, 6, 7, 714/35, 42, 53, 713, 723, 768; 711/200, 202

[56] References Cited

U.S. PATENT DOCUMENTS

| | | | |
|---|---|---|---|
| 3,633,175 | 1/1972 | Harper | 714/710 |
| 4,939,694 | 7/1990 | Eaton et al. | 714/710 |
| 5,200,959 | 4/1993 | Gross et al. | 714/723 |
| 5,278,847 | 1/1994 | Heilbig, Sr. et al. | 714/765 |
| 5,434,868 | 7/1995 | Aichelmann, Jr. et al. | 714/718 |
| 5,579,266 | 11/1996 | Tahara | 365/200 |
| 5,644,541 | 7/1997 | Siu et al. | 365/201 |
| 5,659,678 | 8/1997 | Aichelmann, Jr. et al. | 714/710 |
| 5,781,776 | 7/1998 | Johnston et al. | 714/8 |
| 5,875,349 | 2/1999 | Cornaby et al. | 710/33 |
| 5,938,774 | 8/1999 | Hsu | 714/8 |

*Primary Examiner*—Robert W. Beausoliel, Jr.
*Assistant Examiner*—Christopher Revak
*Attorney, Agent, or Firm*—Proskauer Rose LLP

[57] ABSTRACT

When loading executable machine code into memories, the defective memory locations can be bypassed by properly inserting jump instructions or dummy memory allocation instructions in the program code. Prior to loading the executable code into the memories, defective memory locations are checked and recorded first. The source program code are analyzed to see which instruction step will fall into defective memory locations. Dummy memory space allocation instructions or additional jump instructions, are inserted in the original micro code, such that defective memory locations can be bypassed when the modified program code is loaded into the working memory space. The present invention is useful for loading executable programs in programmable and verifiable memories, such as Flash/EEPROM, EPROM, SRAM and DRAM, etc.

30 Claims, 3 Drawing Sheets

METHOD AND SYSTEM FOR LOADING MICROPROGRAMS IN PARTIALLY DEFECTIVE MEMORY

FIELD OF INVENTION

The present invention relates to a method and system for automatic modification of a program code such that defective memory-cell addresses are functionally bypassed when the modified program code is loaded and executed in a partially defective memory.

BACKGROUND OF THE INVENTION

In the past, memory chips with defective cells will not be sold in the marketplace. However, with the advent of a number of state-of-art techniques, defective memory chip can behave as a defective-free memory chip. And there are a number of patents addressing methods of using partially defective memories as transparently "good" memories. It is well known that defective memory cells can be located by any appropriate testing procedure, such as loading "1" and "0" in each bit location and then verifying the results.

U.S. Pat. No. 4,939,694 to Eaton et. al., describes a self-testing and self-repairing memory system. The memory system tests itself during field use to locate defective memory cells. Once these defective memory cells are located, the memory system uses the error correction code engine to correct these defective memory cells. When the error correction code engine becomes overburdened, then the memory system replaces these defective memory cells.

U.S. Pat. No. 5,644,541, to Siu et. al., describes a memory system comprising a plurality of semiconductor memories with some bad bits, a substitution memory and a mapping logic to redirect accesses to bad-bit locations in the semiconductor memories to good storage cells within the substitution memory.

U.S. Pat. No. 5,278,847, to Helbig, Sr. and Anastasia, describes a fault-tolerating memory system that uses an error-detecting-and correcting (EDAC) code. The reliability of storage is greatly improved by extension of each word to add EDAC encoding and spare-bit portions, as well as by extension of depth to allow spare words to be present, along with high-reliability storage of word maps.

U.S. Pat. No. 5,579,266 to Tahara, handles defective memory by use of laser repair, or programmable fuse repair, and replaces defective memory cells with redundant rows and columns.

Executable machine code are typically generated from the source code of a computer program by the compile and link operations. As the executable machine code is obtained, it is ready to be loaded into memories for program execution. FIG. 1 shows the detailed operations of the compilation, linking and loading operations in accordance with the prior art.

During the first pass compilation 11, the memory-byte allocations for each instruction steps are counted and the relative memory locations of symbols, labels and stack declarations are recorded in a symbol table. In the second pass compilation 13, the object machine code associated with each instruction step and the associated data or address parameters are obtained with proper memory address pointers. The link operation 15 links one or several (already compiled) object code and adds appropriate header to produce the executable machine code. After the program start memory address is determined in block 17, the executable machine code are loaded into programmable memories of a computer, micro-computer, or micro-controller system for program execution.

It is observed that, the error checking and error correcting techniques, or memory re-direct techniques, provided by some of the prior arts inevitably adds overhead to the hardware design and/or program execution each time the executable machine code is executed. On the other hand, the redundant memories, circuits and the defective memory repair work provided by some prior arts also add design and operation complications.

SUMMARY OF INVENTION

A method for loading a program code, which performs a predetermined function, in a memory chip having good memory locations and at least a known defective memory location is provided. The method first modifies the program code according to the defective memory location such that a modified program code is obtained. The modified program code substantially performs the same function as the predetermined function while bypassing the defective memory locations during program execution.

As an example of generating the modified executable machine code, the method further compiles and links the modified program code such that a corresponding set of machine code is obtained. Afterwards the modified machine code is ready to be loaded into the memory for execution.

BRIEF DESCRIPTIONS OF THE APPENDED DRAWINGS

FIG. 1 discloses how the source code is complied, linked and loaded into a memory system in accordance with the prior art.

Figure 2:
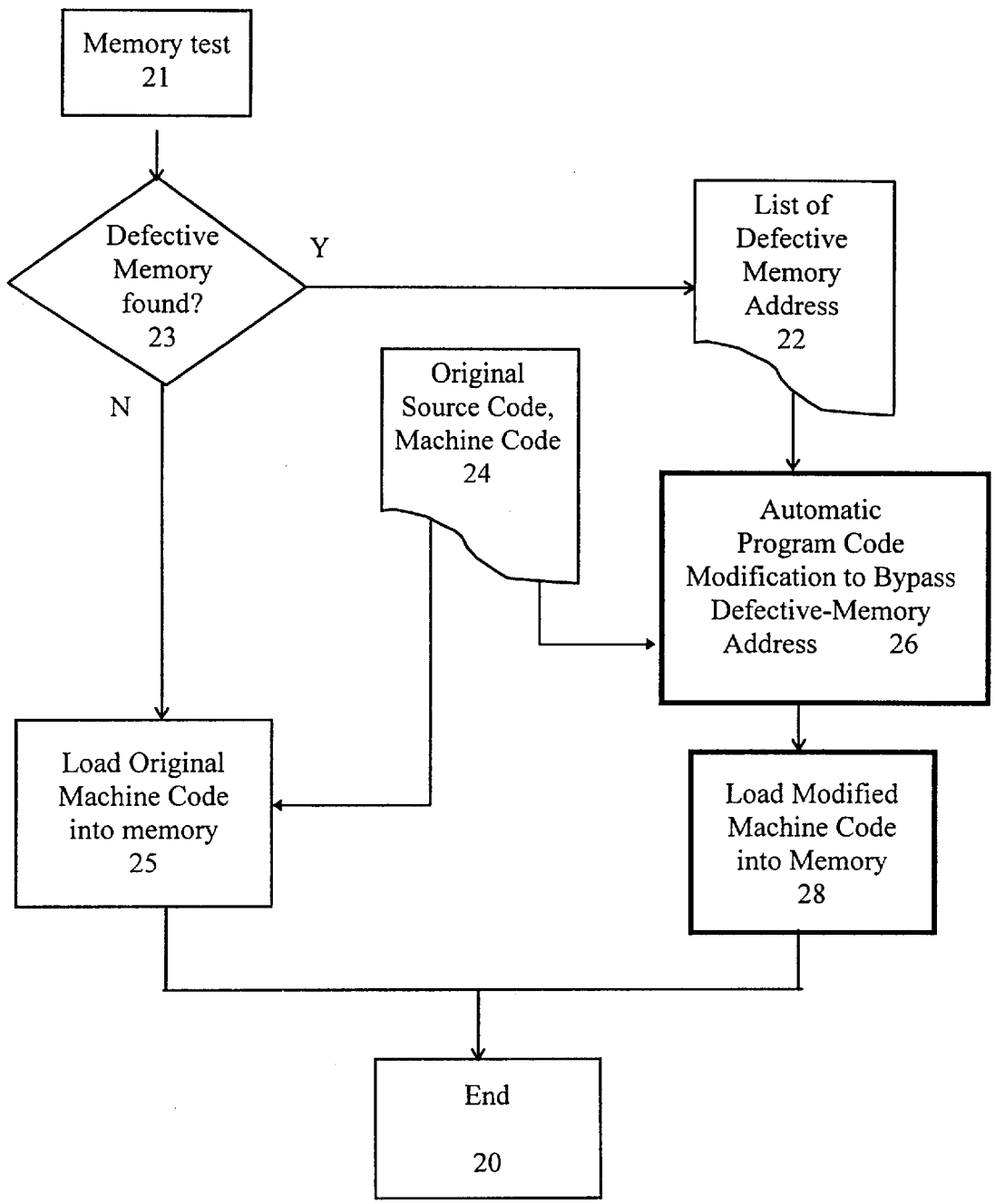

FIG. 2 discloses the general concept of this present invention.

Figure 3:
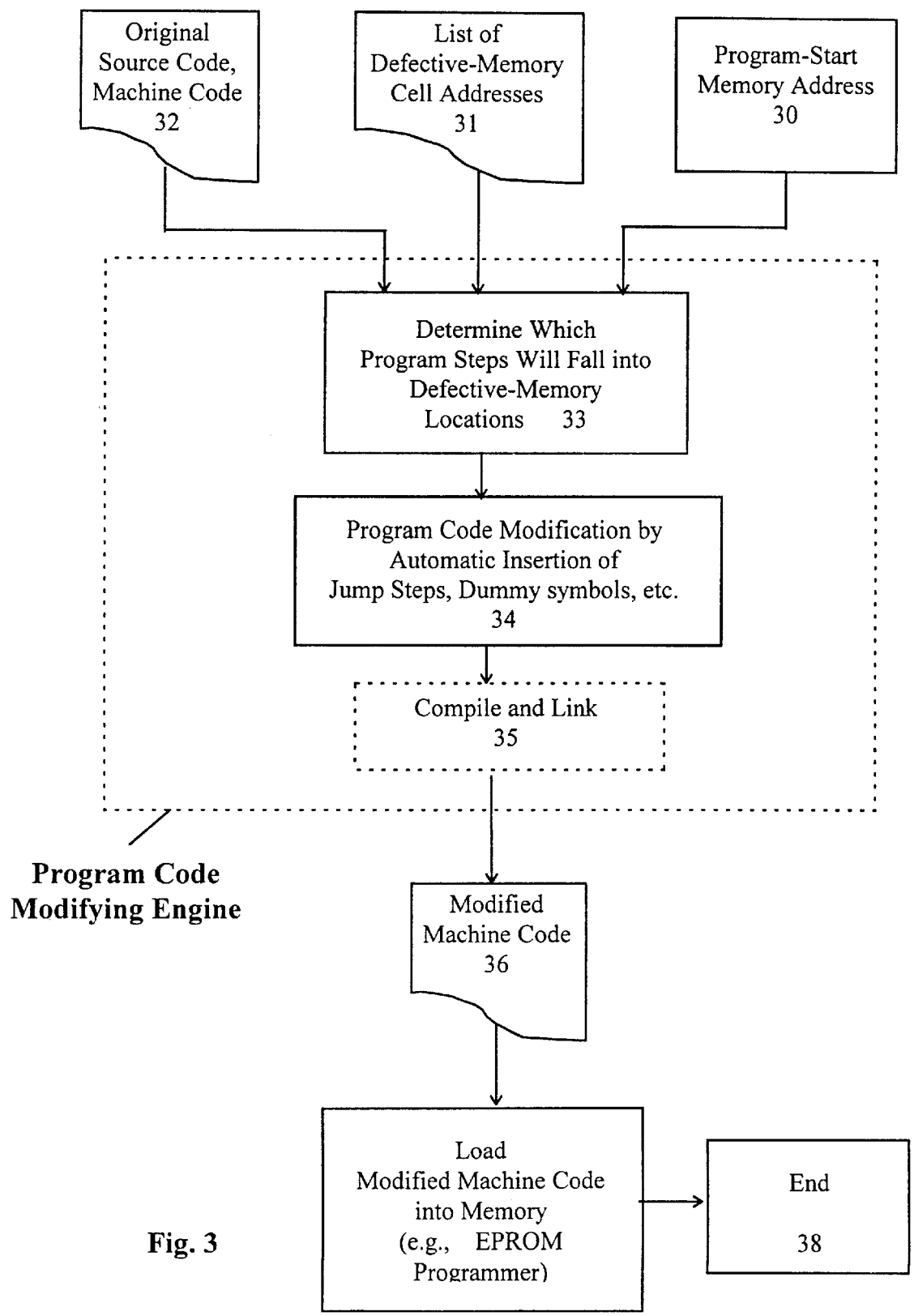

FIG. 3 discloses how the program-code modifying engine modifies the program code and, afterwards, for loading into a memory space having defective cells in accordance with the present invention.

Table 1A shows an example of a microprogram with assumption of the memory location 0134 being defective.

Table 1B shows an example of the present invention of get around the defective memory cell at memory address 0134.

Table 2A shows an example of a microprogram with assumption of the memory cells at locations 0135 and 0136 are defective.

Table 2B shows an example of the present invention to insert a "JMP $+4" instruction at the memory location 0133 which occupies 2 bytes of the memory space.

Table 3A shows an example of a microprogram with assumption of the memory cell at 0015 being defective.

Table 3B shows an example of the second embodiment to get around the location 0115.

DETAILED DESCRIPTIONS OF THE PREFERRED EMBODIMENT

The present invention relates to a method of modifying the program code according to the defective memory locations, such that when the executable machine code are loaded into the memory, the defective memory locations are bypassed during program. The invention is most useful and efficient in a load-once, execute-many-times, microprogram applications.

The present invention also relates to a system, built upon a program-code modifying engine, for modifying the program code according to the defective memory-cell locations and according to a particular programming language instruction sets (e.g., 80×86 instruction sets), such that the modified program code performs the identical functions and routines automatically while bypassing the defective memory locations during program execution.

The general concept of the present invention is illustrated in FIG. 2. In block 21, memory test by any well known method is performed. If defective memory cells are found in block 23, in block 22, address list of the defective memory cells is obtained. In a preferred embodiment, the defective memory location is expressed by an offset value relative to a program-start memory location. In block 26, based on the address list from block 22 and the source code or machine code from block 24, a smart software engine of the present invention modifies the program code such that the program will functionally bypassing the defective memory-cell addresses upon execution. Afterwards, in block 28, the modified machines code are loaded into the memory. On the other hand, if no defective memory is found in block 23, based on the source code or machine code from block 24, in block 25, the present invention directly loads the machine code into the memory. Although not explicitly recited in FIG. 2, it is known that executable machine code are typically generated from the source code of a computer program by the compile and link operations.

FIG. 3 shows an exemplary procedure of implementing the present invention. The program-starting memory address of the available memory space is first determined in block 30. In block 31, the memory space for loading the executable machine code will go through a defect testing procedure to determine the memory addresses associated with defective memory cells. By comparing the memory locations of the pre-compiled machine code, coming from block 32, with the list of defective memory-cell locations from block 31, in block 33, micro instructions that are doomed to fall into the defective memory cells are determined. In block 34, the micro instruction steps are then modified by inserting dummy symbols declaration or jump instruction at appropriate instruction steps in the original program code. Afterwards, in block 35, the modified source code is then compiled and linked by a computer (program-code modifying engine) to generate the modified machine code 36. In block 37, the resultant executable machine code are then loaded into the memory space beginning at the predetermined program starting address. As a result, all defective memory cells are bypassed functionally when the loaded executable machine code are executed.

There are several ways to modify the program code according to the present invention. In the first embodiment of the present invention, a jump instruction step is inserted at the proper microprogram code locations to bypass the memory addresses associated with defective memory cells. This will be described in the following examples.

Table 1A shows an example of a microprogram with assumption of the memory location 0134 being defective. The source code (assembly language program), the corresponding machine code, and the corresponding memory locations of an exemplary microprogram are shown. The instruction step "MOV DS, AX" takes 2 bytes of memory allocations with corresponding machine code as 8E and D8 respectively. The instruction "CLI" takes 1 byte of memory allocation with the machine code as FA. The instruction "MOV DX, 03E0" takes 3 bytes of memory space with the corresponding machine code as BA, E0 and 03. Since the memory location 0134 is defective, the instruction step "MOV DX, 03E0" can not execute properly.

Table 1B shows an example of the present invention to get around the defective memory cell at memory address 0134. For the microprogram, an additional jump instructions is inserted prior to the instruction step "CLI". The added instruction "JMP $+3" is loaded at the memory location 0132 and occupies 2 bytes of memory space. The effect is to jump from the memory address 0132 to the 0132+3=0135 memory address. A meaningless, byte-occupying instruction, such as an "NOP" instruction, is inserted after the "JMP $3" instruction such that the next instruction falls into the good memory location 0135. During the program execution, the memory address 0134 is bypassed and therefore the content of this defective memory cell will not affect the program execution.

Table 2A shows an example of a microprogram with assumption of the memory cells at locations 0135 and 0136 are defective. To conditions set at Table 2A, Table 2B shows an example of the present invention to insert a "JMP $+4" instruction at the memory location 0133 which occupies 2 bytes of memory space. A certain meaningless, two-byte-occupying instruction, such as two "NOP" instructions are inserted after the "JMP $+4" instruction, such that the next instruction falls into the good memory space 0137. During program execution, the effect is to jump from the memory address 0133 to the 0133+4=0137 memory address. The memory addresses 0135 and 0136 are bypassed and therefore the content of this defective memory cells will not affect the program execution.

In the above two examples, it is noted that the jump instruction is inserted at a preceding code location without causing the jump instruction machine code or any instruction-step machine code to fall into the defective memory cell addresses. And the number of bytes (n) skipped as instructed by the "JMP $+n" instruction is $$n \geq \text{Addr(defective)} - \text{Addr(jump)} + 1$$

wherein Addr (defective) is the memory address of the defective memory cell to be bypassed, Addr(jump) is the memory address associated with the inserted jump-instruction machine code.

Alternatively, the "JMP $+n" instruction can be replaced by a "JMP label" instruction with the "label" set at a good memory location succeeding the defective-cell memory location. As the alternative embodiment is adopted, one exemplary modified program code corresponding to that shown in Table 2A is shown in Table 2C. It is clear, due to the insertion of JMP LABEL1 instruction, the defective memory cells at 0135, 0136 are bypassed. A number of NOP instructions can be inserted after the "JMP LABEL" instruction , such that the next instruction falls into the good memory-cell address. It is noted from the above examples that a number of (n–k) "NOP" instructions can be inserted after the "JMP $+n" instruction, such that the next instruction falls into a good memory-cell address. The constant k is the byte length of the "JMP $+n" instruction. It is noted that the inserted NOP instructions can be replaced by other forms of byte-occupying instructions which do not change the functions of the program.

In the second embodiment of the present invention, a dummy "symbol" declaration is inserted at a proper microprogram code location to bypass the memory addresses associated with defective memory cells. This is described in the following examples.

Table 3A shows an example of a microprogram with assumption of the memory cell at 0015 being defective. Four symbols BASE, SUM, ACCUM and TEST are defined with pre-declared memory byte allocations. The symbol BASE allocates 3 bytes of memory space with initial data of 03, 65 and A2 in hex code. The symbol SUM allocates 1 byte of memory space with an initial value of 07. The symbol ACCUM allocates 1 word (2 bytes) of memory space with initial data of FF and FF. The symbol TEST allocates 1 byte of memory space without a pre-defined initial data. The memory allocation for the symbol "ACCUM DW OFFFFH" takes two bytes in memory locations 0014 and 0015. Since the memory cell at address 0015 is defective, and the ACCUM parameter can not be read correctly.

Table 3B shows an example of the second embodiment to get around the location 0015. A "DUMMY1" symbol is inserted in the microprogram preceding the symbol declaration for "ACCUM" step, in this case at the memory location 0014. The memory space declared by the symbol declaration step "DUMMY1 DW ?" are 1 word (2 bytes) at memory locations 0014 and 0015, which covers the defective memory-cell location at 0015. As a result, the memory space declared by the symbol "ACCUM" falls into good memory-cell locations. Since DUMMY1 is a dummy symbol declaration and that symbol is never used elsewhere in the microprogram, therefore the memory content at the address 0014 (good) and the address 0015 (defective) will never be accessed and thus the defective memory location is bypassed during program execution.

In practice, the defective memory testing, the source code (or micro instructions) modification, and the machine code loading are all performed by a single tester/program loader. Or alternatively, those procedures can be done respectively by a memory tester, a separate computer, or a separate EPROM, Flash/EEPROM programmers, etc.

Although the preferred embodiment of the invention are recited using assembly language and machine code of 80×86 microprocessor, it is apparent, the spirit and essence of the invention, which is defined by the following appended claims, is not limit to any specific machine or any specific programming language.

What is claimed is:

1. A method of loading a program code, for executing a predetermined function, in a memory chip having good memory locations and at least a known defective memory location, comprising the steps of:
   (1) modifying the program code according to a list of defective memory locations by inserting dummy code at breakable points in the program code for mapping of defective memory locations and bypassing the dummy code by additionally inserting a jump instruction such that a modified program code is obtained, whereby the modified program code substantially performs the same function as the predetermined function while functionally bypassing the defective memory locations during program execution;
   (2) generating a corresponding set of machine code based on the modified program code; and
   (3) loading the set of machine code into the memory chip.

2. The method of claim 1, wherein the method is implemented by a software routine executed in a computer.

3. The method of claim 1, wherein the step (1) comprising: based on the defective memory location, inserting at least one jump instruction followed by at least a byte-occupying extra instruction in the program code, such that a machine code corresponding to an instruction code after the extra instruction falls into good memory locations.

4. The method of claim 3, wherein the jump instruction is in form of "JMP $+n", wherein n≧Addr(defective)−Addr (jump)+1.

5. The method of claim 3, wherein the jump instruction is in form of "JMP label", wherein label is a good memory location after the defective memory location.

6. The method of claim 1, wherein the step (1) comprising: based on the defective memory location, inserting dummy symbols declaration instruction, such that the memory space declared by a next symbol declaration instruction falls into good memory locations.

7. The method of claim 3, wherein the extra instruction is NOP instruction.

8. The method of claim 1, wherein the corresponding set of machine code is generated by compilation and link of the modified program code.

9. A memory-programmer system comprising:
   a tester for testing a memory chip such that at least a known defective memory location is obtained, the memory chip having good memory locations;
   a program loader for loading a program code, which performs a predetermined function, in said memory chip, by performing the steps of:
   (1) modifying the program code according to the defective memory location such that a modified program code is obtained which is done by inserting dummy code at breakable points in the program code for mapping of defective memory locations and further bypassing the dummy code by additionally inserting a jump instruction;
   (2) generating a corresponding set of modified machine code based on the modified program code;
   (3) loading the set of modified machine code into the memory chip, whereby the modified machine code substantially performs the same function as the predetermined function while functionally bypassing the defective memory locations during program execution.

10. The system of claim 9, wherein the step (1) comprising: based on the defective memory location, inserting at least one jump instruction followed by at least a byte-occupying extra instruction in the program code, such that a machine code corresponding to an instruction code after the extra instruction falls into good memory locations.

11. The system of claim 9, wherein the jump instruction is in form of "JMP $+n", wherein n≧Addr(defective)−Addr (jump)+1.

12. The system of claim 9, wherein the jump instruction is in form of "JMP label", wherein label is a good memory location after the defective memory location.

13. The system of claim 9, wherein the step (1) comprising: based on the defective memory location, inserting dummy symbols declaration instruction, such that the memory space declared by a next symbol declaration instruction falls into good memory locations.

14. The system of claim 10, wherein the extra instruction is NOP instruction.

15. The system of claim 9, wherein the corresponding set of modified machine code is generated by compilation and link of the modified program code.

16. A method for modifying a program code, which performs a predetermined function while executing in a memory chip having good memory locations and a least one known defective memory location, comprising the steps of:
   (1) inputting a list of defective memory locations by inserting dummy code at breakable points in the program code for mapping of defective memory locations and bypassing the dummy code by additionally inserting a jump instruction;
   (2) modifying the program code according to the list of defective memory locations such that a modified program code is obtained, whereby the modified program code substantially performs the same function as the predetermined function while bypassing the defective memory locations during program execution in the memory chip.

17. The method of claim 16, wherein the program code is a source code, and the modified program code is a modified source code.

18. The method of claim 17, wherein the source code is written in ASSEMBLY language.

19. The method of claim 18, wherein a modified machine code is generated based on the modified source code.

20. The method of claim 19, wherein the modified machine code is obtained by compilation of the modified source code.

21. The method of claim 19, wherein the modified machine code is obtained by compilation and link of the modified source code.

22. The method of claim 19, wherein the modified machine code bypasses the defective memory locations when the modified machine code is loaded in the memory chip.

23. The method of claim 16, wherein the defective memory location is expressed by an offset value relative to a program-start memory location.

24. A tester for testing a memory chip having good memory locations and at least a defective memory location, said tester tests the memory chip such that a list of defective memory locations is obtained; said tester further performs functions of:

(1) modifying a program source code according to the defective memory location such that a modified source code is obtained by inserting dummy code at breakable points in the program code for mapping of defective memory locations and bypassing the dummy code by additionally inserting a jump instruction;

(2) generating a corresponding set of modified machine code based on the modified source code, whereby the modified machine code substantially performs the same function as the predetermined function while functionally bypassing the defective memory locations during program execution.

25. The tester of claim 24, wherein the step (1) comprising: based on the defective memory location, inserting at least one jump instruction followed by at least a byte-occupying extra instruction in the source code, such that a machine code corresponding to an instruction code after the extra instruction falls into good memory locations.

26. The tester of claim 25, wherein the jump instruction is in form of "JMP $+n", wherein n≧Addr(defective)–Addr(jump)+1.

27. The tester of claim 25, wherein the jump instruction is in form of "JMP label", wherein label is a good memory location after the defective memory location.

28. The tester of claim 24, wherein the step (1) comprising: based on the defective memory location, inserting dummy symbols declaration instruction, such that the memory space declared by a next symbol declaration instruction falls into good memory locations.

29. The tester of claim 25, wherein the extra instruction is NOP instruction.

30. The tester of claim 24, wherein the corresponding set of modified machine code is generated by compilation and link of the modified source code.

* * * * *